United States Patent
Hamilton et al.

(10) Patent No.: US 9,998,133 B2
(45) Date of Patent: Jun. 12, 2018

(54) DIGITAL-TO-ANALOG CONVERTER WAVEFORM GENERATOR

(71) Applicant: Analog Devices, Inc., Norwood, MA (US)

(72) Inventors: David Hamilton, Edinburgh (GB); Tom Clayton, Edinburgh (GB); Gordon Sharp, Edinburgh (GB); Ian Stevenson, Edinburgh (GB)

(73) Assignee: Analog Devices, Inc., Norwood, MA (US)

( * ) Notice: Subject to any disclaimer, the term of this patent is extended or adjusted under 35 U.S.C. 154(b) by 0 days. days.

(21) Appl. No.: 15/656,964

(22) Filed: Jul. 21, 2017

(65) Prior Publication Data

US 2017/0324422 A1 Nov. 9, 2017

Related U.S. Application Data

(60) Continuation of application No. 15/088,322, filed on Apr. 1, 2016, now abandoned, which is a division of application No. 14/861,208, filed on Sep. 22, 2015, now Pat. No. 9,705,523, which is a division of application No. 14/481,636, filed on Sep. 9, 2014, now Pat. No. 9,246,503.

(60) Provisional application No. 61/875,346, filed on Sep. 9, 2013.

(51) Int. Cl.
| | |
|---|---|
| *H03M 1/06* | (2006.01) |
| *H03M 1/08* | (2006.01) |
| *H03M 1/10* | (2006.01) |
| *H03M 1/66* | (2006.01) |

(52) U.S. Cl.
CPC ........... *H03M 1/08* (2013.01); *H03M 1/1085* (2013.01); *H03M 1/66* (2013.01)

(58) Field of Classification Search
CPC ........ H03M 1/08; H03M 1/66; H03M 1/1085; H03M 1/10; H03M 1/1009; H03M 1/1071; H03M 2201/63; H03M 3/38; H03M 1/203; H03M 1/207; H03M 1/06; H03M 1/1023
USPC ................................ 341/118, 144, 120, 119
See application file for complete search history.

(56) References Cited

U.S. PATENT DOCUMENTS

| | | |
|---|---|---|
| 3,747,089 A | 7/1973 | Sharples |
| 4,191,900 A | 3/1980 | Redfern et al. |
| 4,450,368 A | 5/1984 | Spence |
| 4,641,246 A | 2/1987 | Halbert et al. |
| 4,924,226 A | 5/1990 | Adams |
| 5,238,792 A | 8/1993 | Prementine et al. |

(Continued)

FOREIGN PATENT DOCUMENTS

EP 2372916 A2 10/2011

OTHER PUBLICATIONS

"U.S. Appl. No. 14/481,636, Ex Parte Quayle Action mailed Aug. 4, 2015", 4 pgs.

(Continued)

*Primary Examiner* — Jean B Jeanglaude
(74) *Attorney, Agent, or Firm* — Schwegman Lundberg & Woessner, P.A.

(57) ABSTRACT

A method for testing a DAC comprising controlling the DAC digitally to cause it to produce a known desired analog output, for example a fixed amplitude sine wave; determining the duration of fixed voltage segments of the actual output of the DAC and using the duration of the fixed voltage segments to assess or determine performance of the DAC.

25 Claims, 15 Drawing Sheets

(56) References Cited

U.S. PATENT DOCUMENTS

| | | | |
|---|---|---|---|
| 5,283,792 A | 2/1994 | Davies, Jr. et al. | |
| 5,660,355 A | 8/1997 | Waymeyer | |
| 6,897,794 B2* | 5/2005 | Kuyel | H03M 1/1038 |
| | | | 341/120 |
| 7,026,966 B2 | 4/2006 | Theiler | |
| 7,443,323 B2* | 10/2008 | Rotchford | H03M 1/1047 |
| | | | 341/118 |
| 7,583,210 B2* | 9/2009 | Minobe | H03M 1/0607 |
| | | | 341/118 |
| 7,746,256 B2 | 6/2010 | Wiesbauer et al. | |
| 7,773,011 B2 | 8/2010 | Sahu et al. | |
| 8,223,044 B2* | 7/2012 | Snedeker | H03M 1/1047 |
| | | | 341/118 |
| 8,488,955 B2 | 7/2013 | Yamazaki | |
| 9,246,503 B1 | 1/2016 | Hamilton et al. | |
| 9,705,523 B1 | 7/2017 | Hamilton et al. | |
| 2002/0005794 A1 | 1/2002 | Yamaguchi | |
| 2005/0035750 A1 | 2/2005 | Lin | |
| 2006/0256207 A1 | 11/2006 | Kokubo et al. | |
| 2008/0298716 A1 | 12/2008 | Yamagata | |
| 2009/0185649 A1 | 7/2009 | Webster et al. | |
| 2011/0187390 A1 | 8/2011 | Lin et al. | |
| 2013/0335150 A1 | 12/2013 | Sai | |
| 2014/0043502 A1 | 2/2014 | Ioka | |
| 2016/0218730 A1 | 7/2016 | Hamilton et al. | |

OTHER PUBLICATIONS

"U.S. Appl. No. 14/481,636, Non Final Office Action dated Mar. 6, 2015", 10 pgs.

"U.S. Appl. No. 14/481,636, Non Final Office Action dated Jun. 17, 2015", 4 pgs.

"U.S. Appl. No. 14/481,636, Notice of Allowance dated Sep. 17, 2015", 5 pgs.

"U.S. Appl. No. 14/481,636, Response filed Feb. 18, 2015 to Restriction Requirement dated Feb. 5, 2015", 1 pg.

"U.S. Appl. No. 14/481,636, Response filed Jun. 4, 2015 to Non Final Office Action dated Mar. 6, 2015", 6 pgs.

"U.S. Appl. No. 14/481,636, Response filed Jul. 1, 2015 to Non Final Office Action dated Jun. 17, 2015", 7 pgs.

"U.S. Appl. No. 14/481,636, Response filed Aug. 19, 2015 to Ex Parte Quayle Action mailed Aug. 4, 2015", 5 pgs.

"U.S. Appl. No. 14/481,636, Restriction Requirement dated Feb. 5, 2015", 5 pgs.

"U.S. Appl. No. 14/861,208, Non Final Office Action dated Feb. 17, 2016", 7 pgs.

"U.S. Appl. No. 14/861,208, Non Final Office Action dated Aug. 15, 2016", 7 pgs.

"U.S. Appl. No. 14/861,208, Notice of Allowance dated Mar. 3, 2017", 7 pgs.

"U.S. Appl. No. 14/861,208, Notice of Allowance dated Mar. 17, 2017", 5 pgs.

"U.S. Appl. No. 14/861,208, Response filed Jan. 17, 2017 to Non Final Office Action dated Aug. 15, 2016", 4 pgs.

"U.S. Appl. No. 14/861,208, Response filed Jan. 21, 2016 to Restriction Requirement dated Dec. 11, 2015", 1 pg.

"U.S. Appl. No. 14/861,208, Response filed Jul. 15, 2016 to Non Final Office Action dated Feb. 17, 2016", 6 pgs.

"U.S. Appl. No. 14/861,208, Restriction Requirement dated Dec. 11, 2015", 5 pgs.

"U.S. Appl. No. 15/088,322, Examiner Interview Summary dated Jan. 25, 2017", 3 pgs.

"U.S. Appl. No. 15/088,322, Final Office Action dated Sep. 27, 2016", 8 pgs.

"U.S. Appl. No. 15/088,322, Non Final Office Action dated Jun. 8, 2016", 7 pgs.

"U.S. Appl. No. 15/088,322, Non Final Office Action dated Jul. 18, 2016", 7 pgs.

"U.S. Appl. No. 15/088,322, Notice of Allowability dated May 12, 2017", 2 pgs.

"U.S. Appl. No. 15/088,322, Notice of Allowance dated Apr. 25, 2017", 5 pgs.

"U.S. Appl. No. 15/088,322, Response filed Mar. 24, 2017 to Final Office Action dated Sep. 27, 2016", 4 pgs.

"U.S. Appl. No. 15/088,322, Response filed Sep. 16, 2016 to Non Final Office Action dated Jul. 18, 2016", 6 pgs.

\* cited by examiner (different input rise rates)

(different input rise rates)

(inputs at different times)

DIGITAL-TO-ANALOG CONVERTER WAVEFORM GENERATOR

CROSS-REFERENCE TO RELATED APPLICATIONS

This application is a continuation of U.S. application Ser. No. 15/088,322, filed Apr. 1, 2016, which is a divisional of U.S. application Ser. No. 14/861,208, filed Sep. 22, 2015, which is a divisional of U.S. application Ser. No. 14/481,636, filed Sep. 9, 2014, which claims priority from U.S. Provisional Application No. 61/875,346 filed on Sep. 9, 2013, the entire contents of which are incorporated herein by reference.

FIELD OF THE INVENTION

The present invention relates to test, for example built in self-tests (BIST), for very high purity output analog devices such as high fidelity audio output devices.

BACKGROUND OF THE INVENTION

For more than thirty years, the trend in the semiconductor industry has been to replace analogue circuitry with digital circuitry. Since the real world is analogue, this trend can never fully eliminate the conversion circuitry required to take real-world signals in and out of the digital domain. Most new chips being designed are now so-called mixed signal chips. These have mainly digital components, but a substantial number of converters (ADCs and DACs) are required.

During manufacturing each chip must be checked against a specification. The tests for converters are disproportionately expensive in relation to their size on the chip compared with the rest of the chip circuitry which is digital. At present, most tests are done using external test equipment with physical test-heads that are brought into contact with the circuit to allow a test to be conducted. Usually access to test the chip is restricted to pads around the chip edges. Access is getting harder because more, smaller functional blocks on the same size of chip must be tested. Physical test-heads have not kept up the rate of shrinkage that transistors have experienced. Built-in self-test (BIST) for analogue circuits is recognised as a viable way forward, but no commercial solution has yet emerged.

Received wisdom in the semiconductor industry demands that test circuit performance be higher specification than the circuit under test (CUT). Since CUTs typically push the limits of achievable performance, this apparently precludes creating a better test circuit on-chip. EP 11250312.3 describes a technique that shows the general barrier can be circumvented by splitting up the parameters to be tested. In this way, only narrow aspects of the test circuitry are required to be better than the corresponding aspect of the circuit under test. The highest performance is not required simultaneously across all the tested parameters. Thus, performance of the test circuit can be focussed on target aspects, so the task is now achievable.

For example, for the testing of very high fidelity audio output devices (DACs), received wisdom states that an ADC of higher performance must be used to measure the output and conventional signal processing requiring significant computing capability must be deployed. This is impracticable for a compact on-chip solution. Typically, for testing an audio DAC, it is set to output a fixed amplitude sine wave (for example 1 kHz) that is accurately monitored. A Fourier transform to the frequency domain is applied to detect any harmonic distortion. System-on-chip circuit designs tend to have more difficult challenges associated with analogue sections than with digital sections.

U.S. Pat. No. 7,026,966 describes a BIST for a DAC. The DAC output is held steady at a chosen code Ca and sampled on to a capacitor (as Va). Next the DAC is set to another code Cb and held steady. The DAC output and Va are connected to the inputs of a comparator, such that when the DAC input is changed back to Ca the output rises towards Va, tripping the comparator. The time for the DAC output to get back to Va is measured. This time measure is used to estimate the voltage step that the DAC output. This type of test is known as a static test and does not test essential dynamic behaviour compulsory to check audio and similar devices.

U.S. Pat. No. 7,773,011 describes a BIST for a resistor ladder DAC. The BIST relies on an externally generated analogue test voltage and compares it with the DAC output voltage to provide a digital pass/fail. This is carried out in a test mode where the resistor ladder in the DAC is connected through the test circuit in such a way as to allow testing of the individual resistors. A disadvantage of this arrangement is that an external voltage must be generated and so it still requires analog inputs from a tester. Also, the circuit described can test only static characteristics. A further disadvantage is that the test circuit is integrated as a part of the DAC. It is not a separate and independent test structure.

SUMMARY OF THE INVENTION

According to one aspect of the present invention, there is provided a method for testing a DAC, the method comprising: inputting digital control to the DAC to produce a desired analogue output, for example a fixed amplitude sine wave; determining a duration of fixed voltage segments of the actual output of the DAC, and using the fixed voltage segments and the duration of these segments to check or assess performance of the DAC.

Using a measure of the time taken for the output of the DAC to move between fixed voltages provides a simple and effective DAC test. This can be implemented using very simple components, for example one or more comparators and a digital signal processor. All or some such components can be readily and cheaply included on a chip with minimal footprint, thereby providing a fully or partially BIST solution.

The method may involve segmenting the output of the DAC prior to determining the duration of the fixed voltage segments. Each segment may extend over a voltage range that is slightly larger than that of the fixed voltage segments.

According to another aspect of the invention, there is provided a system for testing a DAC, the system being configured to: apply to the DAC a digital control signal representing discrete time samples of the DAC's desired output voltage at every clock cycle time to produce a desired output, for example a fixed amplitude sampled sine wave; determine a duration of fixed voltage segments of the actual output of the DAC; and use the fixed voltage segments and the duration of these segments to check or assess performance of the DAC.

The system may have a digital signal processor for controlling application of the digital input signal, representing an analog signal such as a sampled sinewave to the DAC.

The digital signal processor uses the duration of each segment to estimate one or more parameters or figures of merit of the output of the DAC to assess or determine the DAC performance.

One or more comparators may be used to determine when the signal passes upper and lower thresholds that define the fixed voltage segments. An improved comparator architecture well suited to extremely high resolution infrequent timing may be used.

According to another aspect of the invention, there is provided a method for testing an ADC using a DAC comprising determining non-idealities of the DAC by inputting a digital control signal to the DAC to produce a desired analogue output, for example a fixed amplitude sine wave; determining a duration of fixed voltage segments of the actual output of the DAC, and using the fixed voltage segments and the duration of these segments to assess or determine the performance of the DAC, for example to identify signal non-idealities of the DAC, and correcting the signal non-idealities in the frequency domain based on the determined DAC non-idealities.

According to still another aspect of the invention, there is provided a comparator circuit incorporating a gain stage, an integrator stage connected to the gain stage for integrating an output of the gain stage, and a comparator connected to the integrator stage. The integrator is connected to the positive input of the comparator.

The gain stage may have an output that has low variance in propagation delay independent of input signal slope. Preferably, the gain stage is without a positive feedback gain loop.

The integrator stage may integrate signal activity around input crossing points and infer the precise crossing point based on accumulated voltage. The input to the integrator may saturate to two states with a variable transition time between them and output is processed separately.

The integrator stage may have a ramp rate that is controlled by the input states and is used to increases time resolution.

BRIEF DESCRIPTION OF THE DRAWINGS

Various aspects of the invention will now be described by way of example only and with reference to the accompanying drawings, of which:

FIG. 3 is an expanded view of the plots of FIG. 2 showing upper and lower thresholds that define trigger points at which measurements are made, and the upper and lower rebase settings that the signal is chopped to;

DETAILED DESCRIPTION OF THE DRAWINGS

Figure 1:
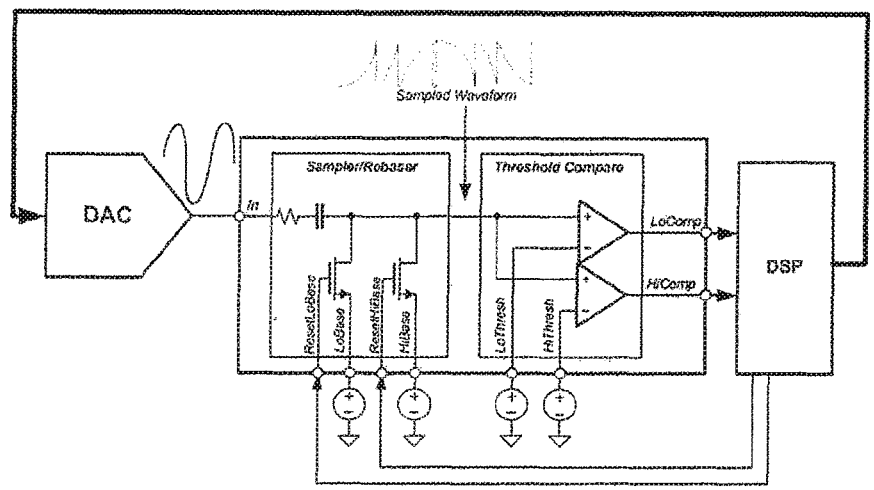
FIG. 1 is a schematic circuit diagram of a built in self-test circuit and DAC under test.

The tests of the present invention can be implemented on or off chip. By way of example, FIG. 1 shows a built in self-test (BIST) circuit for use in high fidelity audio output circuits. However, it will be appreciated that the test described could equally be implemented off-chip. The BIST has as a digital signal processor for generating test signal digital data for applying to the DAC under test. Typically, the test signal is a simple fixed amplitude sine wave. The output of the DAC is connected to a sampler/re-baser circuit that is in turn connected to a threshold circuit.

The threshold circuit has two comparators. The output of the sampler/re-baser circuit is connected to the positive inputs of the two comparators. The negative input of the first comparator is connected to a low threshold voltage (LoThresh) and the negative input of the second comparator is connected to a higher threshold voltage (HiThresh). The output of the first comparator defines a low voltage threshold (LoComp). The output of the second comparator defines a high voltage threshold (HiComp). Together the outputs of the two comparators define precisely a fixed voltage difference (i.e. HiComp−LoComp). The outputs of both comparators are connected to the digital signal processor. Thus, the comparators' outputs trigger as their common positive input signal traverses from one threshold voltage to the other. The comparator outputs start and subsequently stop a clock counter (not shown) to monitor the time taken to traverse between thresholds. The time data is stored. Alternatively a single comparator may be employed instead of two, by switching the applied reference voltage from the one to the other after the first has been exceeded and repeating. This will be described in more detail later.

The sampler/re-baser circuit is connected between the DAC and the threshold circuit. This has a resistor and capacitor connected in series. Between the capacitor and the comparators of the threshold circuit are provided two switches, in this case transistor switches, connected in parallel. The first transistor switch is connected to a reference voltage LoBase. The second transistor switch is connected to reference voltage HiBase. The reference voltages LoBase and HiBase are different, and fixed. The precise value of the reference voltages does not have to be known, but they define a voltage difference that is a fraction of the full sine wave peak to peak amplitude. The transistor switches and reference voltages LoBase and HiBase are used to sample or rebase the output of the DAC to produce a series of segments, each extending over the voltage range defined by the reference voltages LoBase and HiBase. The voltage range defined by reference voltages LoBase and HiBase extends slightly beyond that of the voltage difference set by the comparators.

The circuit is constrained to carry out voltage comparisons at fixed voltages which has many advantages in a real circuit. Many measurements are made of the time the signal takes to pass through the same two (or more) fixed voltages, whose precise value need not be known. The data recorded is the time between 'triggers' and the phase of the signal from the DAC (known because it is controlled by BIST). The digital signal is processed to untangle the multitude of 'difference' data points and reconstruct the input signal, for example a sine wave on which a compact harmonic (and other frequency) extraction process can be applied. Tests have shown that the raw, pseudo-differential data is immune to noise, even outperforming noise reduction from a conventional full FFT based on high resolution 'perfect' ADC acquired sampling when assessing higher order harmonics. By using the switches and reference voltages LoBase and HiBase to rebase the signal the demands on the comparator are reduced.

Figure 2:
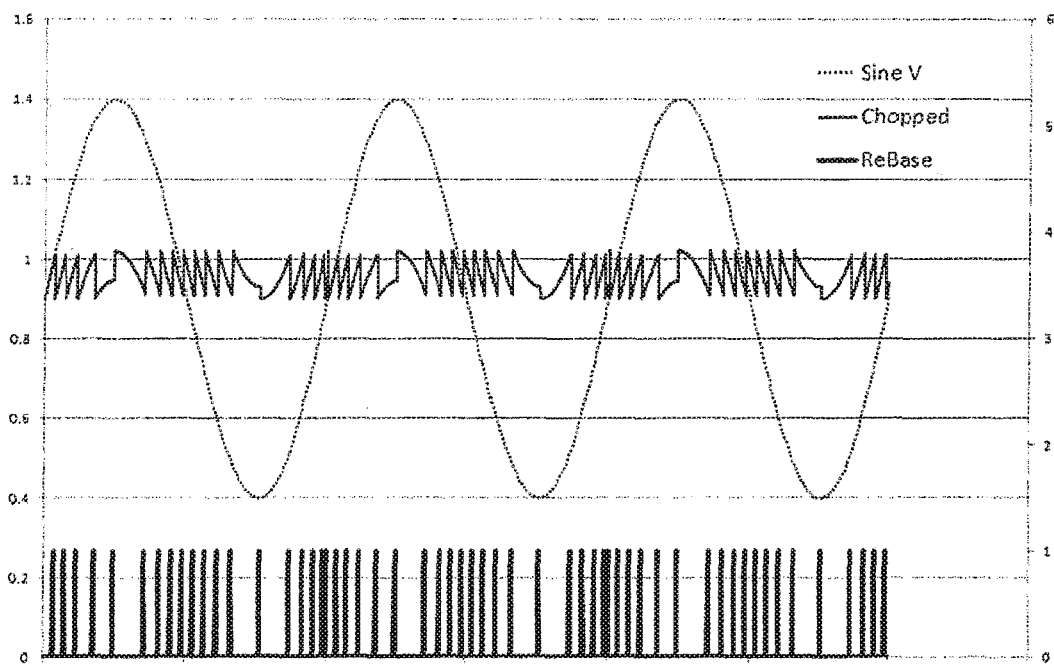
FIG. 2 is plot of a fixed amplitude sine wave signal, a chopped/rebased output that has segments that extend over the same voltage difference, and a signal that represents the time difference between adjacent segments of the chopped/rebased output.
Figure 3:
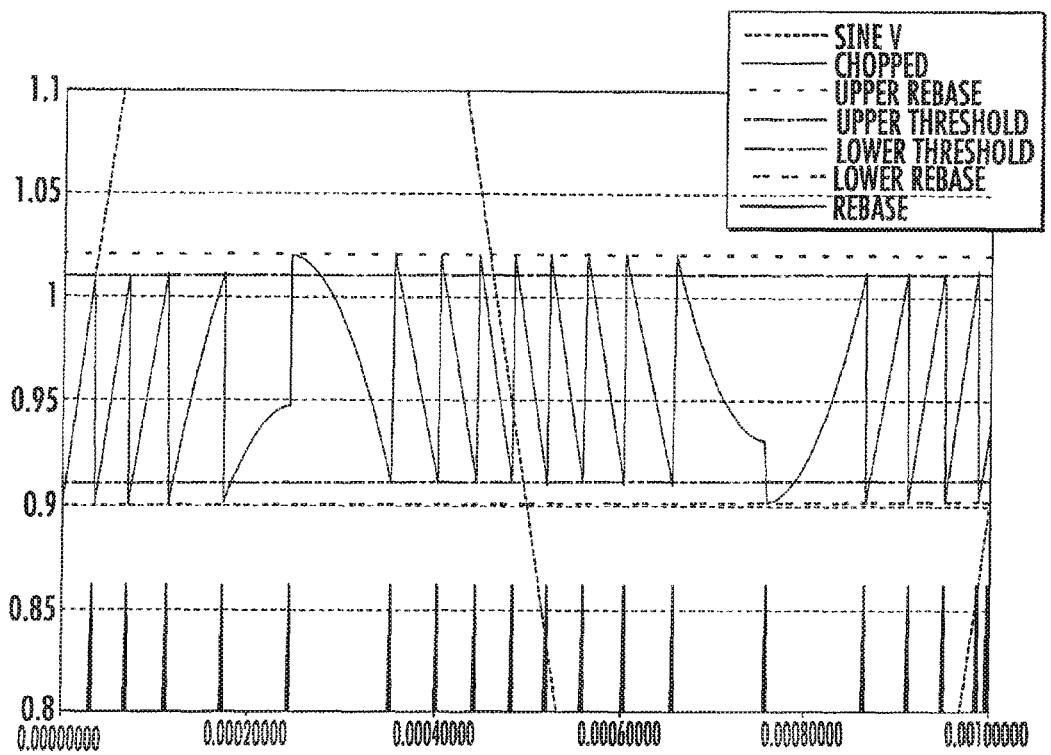

FIG. 2 shows a plot of the input sine wave, the chopped/rebased signal (overlying the input sine wave) that is divided into fixed voltage segments, and a series of pulses (lower trace) representative of the times at which the chopped input signal segments passes through the fixed voltages. The duration of each segment of the chopped/rebased signal corresponds to the time difference between the pulses of the lower trace. This can be more clearly seen in FIG. 3, which shows an expanded view of the plots of FIG. 2. Here, various voltage thresholds and rebase levels are shown. The upper and lower voltage thresholds set the unchanging trigger voltage points of the comparators. The comparator output flips at the trigger point accurately sensing the start and end point in time of the voltage segment, so that the time measurements provide a precise indication of the time taken for the signal to move from one fixed threshold to the other. The upper and lower rebase levels are set by the rebase transistors and are used to rebase segments of the measured signal to a level that ensures that the comparator thresholds will be passed. To this end, the lower rebase level (LoBase) is slightly below the lower threshold (LoThresh) and the upper rebase level (HiBase) is slightly above the upper threshold (HiThresh).

Thus in practice, the signal output from the DAC is segmented, and each segment is sequentially rebased to one of the rebase levels. When the signal is increasing, as shown on the far left of FIG. 3, each segment is rebased to the lower rebase level. As the segment increases, it passes the lower threshold level at which point the time measurement is triggered. The signal continues to increase until it hits the upper threshold, at which point the time measurement is stopped. At this stage, the signal is rebased to the lower rebase level, and the next signal segment is processed. This continues until the turning point of the signal is detected, and the voltage signal starts to decrease again. When this happens, the upper rebase level is used to rebase the signal. In this case, as the voltage decreases, it passes the upper threshold level at which point the time measurement is triggered. The signal continues to decrease until it hits the lower threshold, at which point the time measurement is stopped. The signal decreases slightly past the lower threshold. At this stage, the signal is rebased to the upper rebase level, and the next signal segment is processed, until the next turning point in the signal is detected and the signal slope changes again.

The precise timing as the rebased signal passes through the threshold voltages (LoThresh and HiThresh) can be measured very accurately by monitoring the comparators' outputs (LoComp and HiComp) and counting cycles of a very fast clock. The precise size of the voltage gap between the two comparator thresholds is not critical. The only requirement is that it does not change whichever section of the sine is being measured. Likewise the small extra rebase voltage to the high and low references is not critical, merely that it allows for any settling to occur before the actual time difference (Delta T) measurement is taken.

Figure 4:
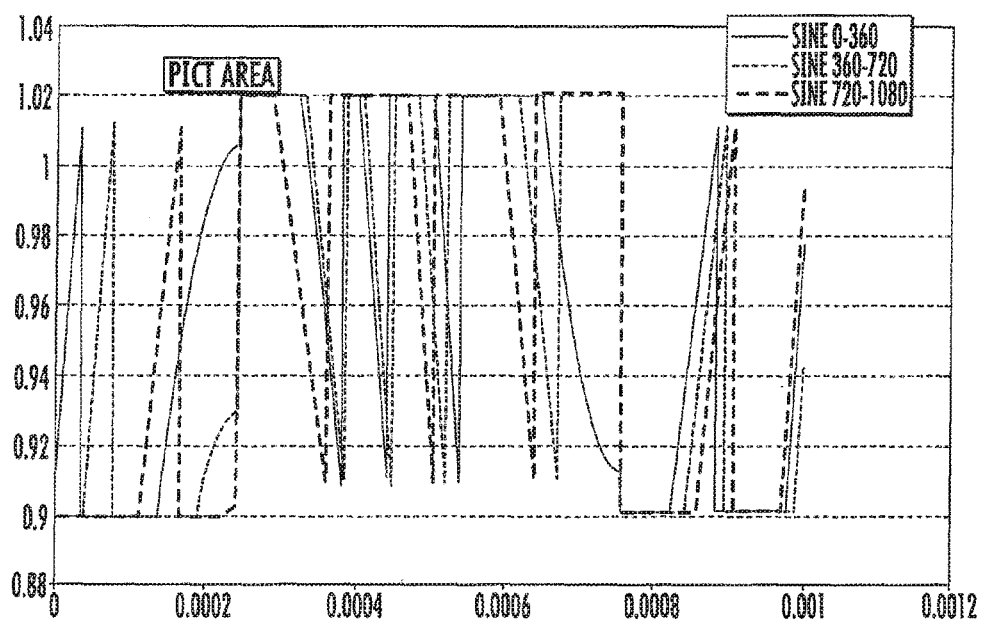
FIG. 4 shows plots of different periods of the sine input signal collected over several cycles.

Since the BIST can control the DAC to create the sine output signal, the rebasing points can be controlled to measure virtually any part of the signal. FIG. 4 shows how samples taken from subsequent periods of the sine signal (shown in different line styles) can fill in gaps in the sample data known as schmooing.

The precise measurement points do not have to be accurately controlled, and there is no need to have information directly relating to the absolute voltage at any precise phase along the sine wave, only the time between fixed voltage differences. The many difference values can be assembled to estimate the amplitude at any given phase thereby. This then permits a transform into the frequency domain to be carried out with a limited number of stored samples (dictated by the Nyquist criteria) effectively representing an aggregate sine wave.

Figure 5:
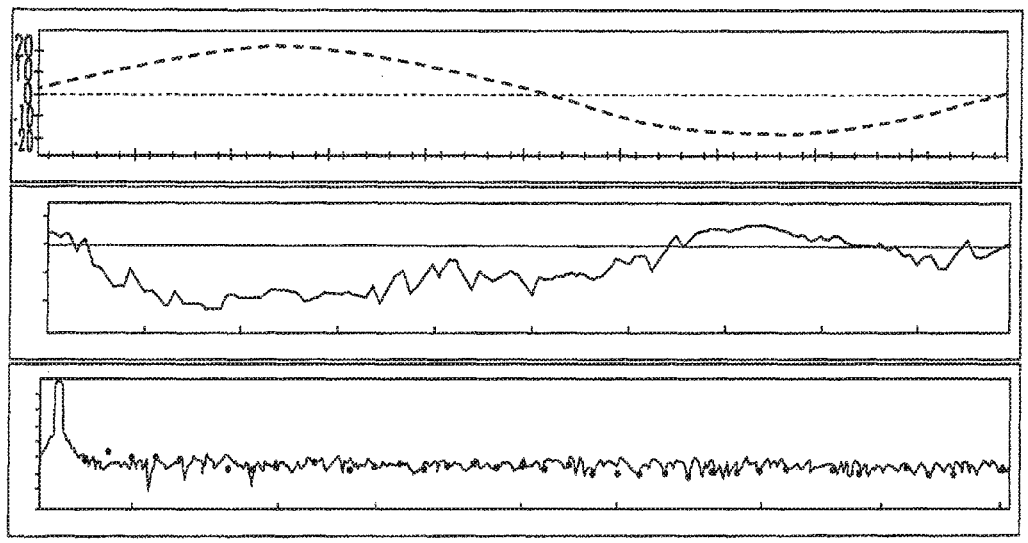
FIG. 5 shows a sine wave reconstructed using the output of the BIST of FIG. 1; the difference between the reconstructed sine wave and the original input; and a conventional FFT obtained by over sampling with an ideal high resolution analogue to digital converter.
Figure 6:
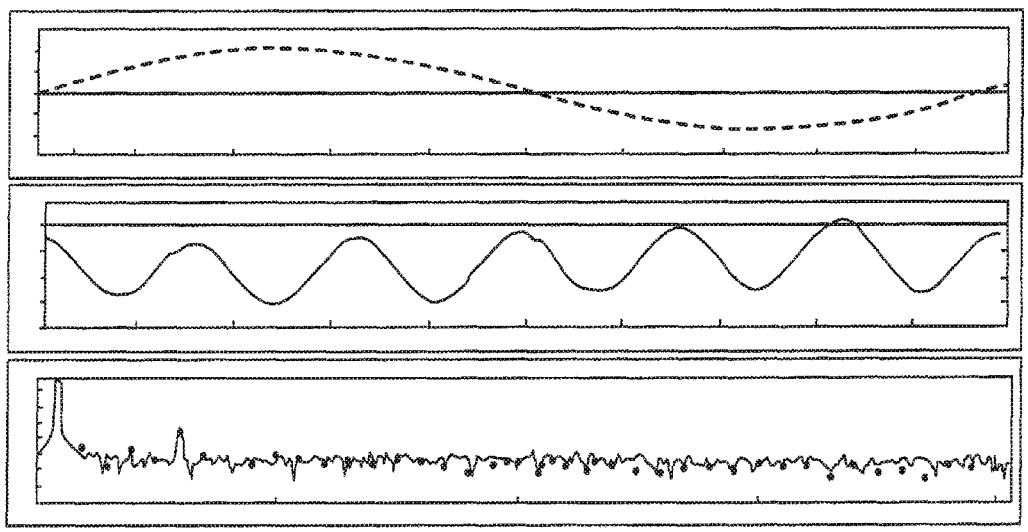
FIG. 6 shows plots similar to those of FIG. 5, but in which a $6^{th}$ harmonic distortion is added.

FIG. 5 shows the reconstructed sine wave (top trace) based on these estimates for a 1 kH tone in noise with no harmonic distortion and some noise. The middle trace shows the difference between the reconstructed signal and the original (a tiny residual of the fundamental which does not impact the measurement of the distortion). The lowest trace is a conventional FFT obtained by simulating over sampling with a perfect high resolution analogue to digital convertor. The black dots show the discrete frequency points found using the data obtained as described in the current invention. The performance of the two is comparable in this case. FIG. 6 shows the same traces as for FIG. 5, but this time a $6^{th}$ harmonic distortion is introduced 70 dB down. Again the performance of the BIST of FIG. 1 closely matches the conventional FFT approach. The noise floor is even lower for the higher harmonics. For explanation purposes the time domain estimated reconstruction of the harmonic distortion is also shown in the middle trace.

Figure 7:
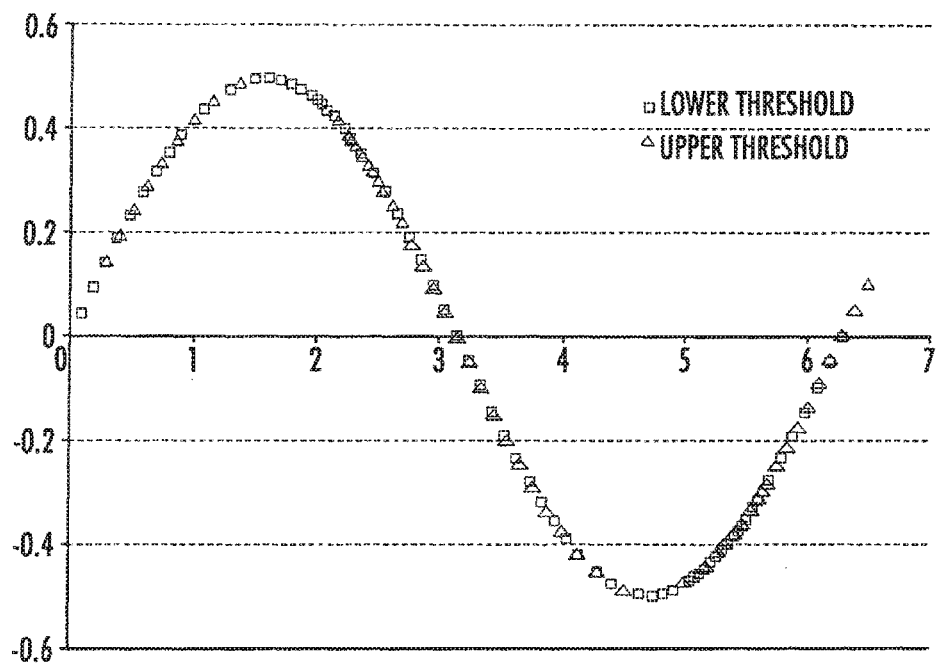
FIG. 7 shows pairs of samples points with different thresholds used by the BIST of FIG. 1 to reconstruct an estimate of the DAC output.

FIG. 7 shows the time each measurement has crossed an upper and lower threshold giving a measurement pair separated by a fixed voltage illustrating how schmooing covers the entire sine wave over several sine wave repetitions.

Figure 8:
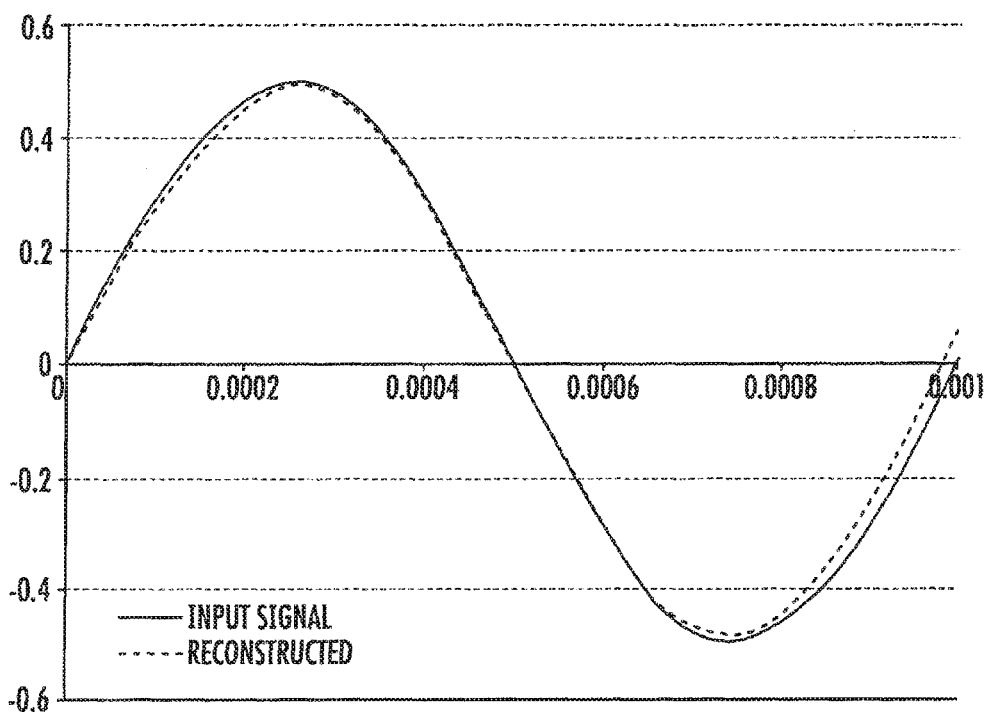
FIG. 8 shows a plot of an input signal and the estimate of the DAC output as reconstructed from the output of the BIST of FIG. 1, illustrating an accumulated DC offset which may be removed by DSP, exaggerated to highlight the method.
Figure 9:
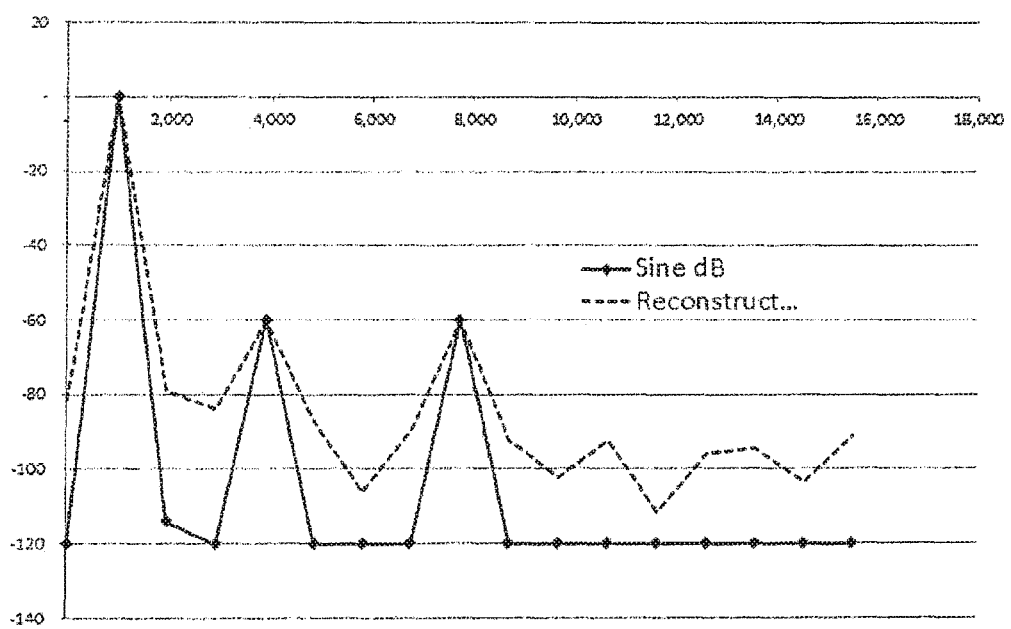
FIG. 9 shows spectral plots of an input signal and reconstructed signal correctly detecting harmonic defects in the presence of very high level of noise and 2 harmonic distortion peaks both correctly detected by the BIST.

A consequence of reconstructing the full sine wave signal from the many differences measurements is a low frequency random drift of the reconstructed signal, as can be seen from FIG. 8. The error associated with joining the small sections accumulates (akin to summed noises magnitudes) and gives a small 'DC' offset after a whole sine wave as shown in FIG. 8. For the purposes of explanation an unrealistically large 6 mV RMS noise on samples of 1V signal is assumed. The DC 'droop' at end of the sine wave causes spectral leakage which may optionally be removed in digital signal processing using the knowledge the sine wave should always returns to the same DC level. For example a simple linear fit to adjust each sample in a sine wave to ensure zero shift in the DC by the end of each sample. A reconstruction of the spectrum with an unrealistically large estimate of noise is shown for the purpose of illustration in FIG. 9. Here, 0.6 mv in 1 v noise plus $4^{th}$ and $8^{th}$ 1% H4 and H8 harmonics are present in the sine signal under test. The spectral leakage raises the noise floor at low frequencies.

A technique for reconstructing the data will now be described in more detail. As noted above, data collection is split into sampling segments, where each sample consists of measuring the time, in clock cycles, of the period between the output of the DAC crossing one reference voltage to it crossing a second reference that is a fixed voltage away from the first. Samples are collected as rapidly as possible whilst the test signal is being generated. The duration of the test signal is chosen to provide a minimum level of samples needed to generate the required amount of noise floor attenuation during the post processing Fourier analysis.

Figure 10:
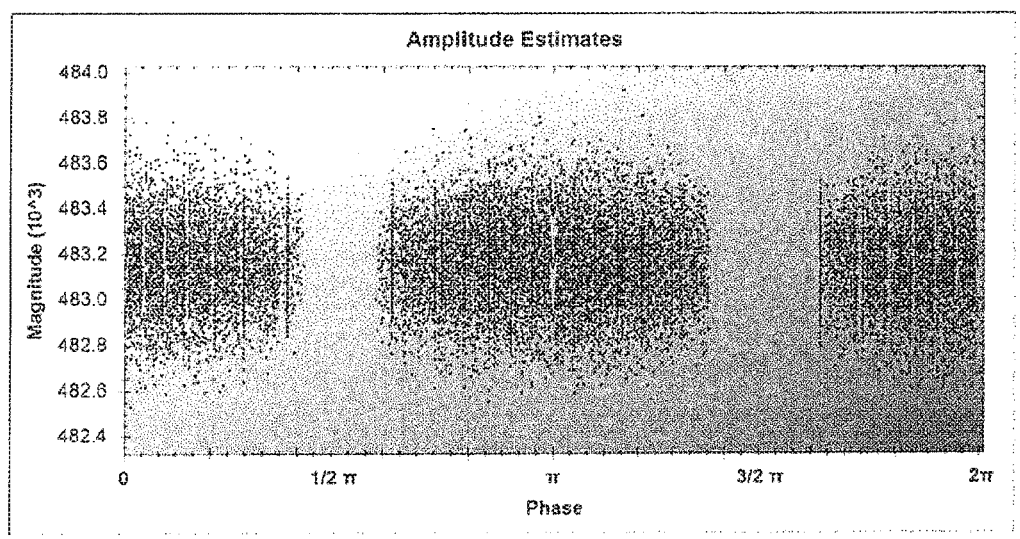
FIG. 10 shows the distribution of amplitude estimates against phase for a 20-bit DAC under test, outputting a fundamental with second harmonic distortion at −80 dB and a third harmonic distortion at −90 dB.

Using the known difference between the voltage references, the times of the test signal sine wave crossing each of the voltage references relative to the test signal phase, the magnitude of the test signal, and Equation 1, an amplitude estimate of an ideal sine wave that passes through the two references at the recorded phase times is calculated.

$$A = \frac{V_B - V_A}{\sin\phi_B - \sin\phi_A} \qquad \text{Equation 1}$$

where:
  $A \rightarrow$ Amplitude Estimate
  $V_B \rightarrow$ Voltage reference B
  $V_A \rightarrow$ Voltage reference A
  $\phi_A \rightarrow$ Phase of the sine wave as it crosses voltage reference A
  $\phi_B \rightarrow$ Phase of the sine wave as it crosses voltage reference B FIG. 10 shows the distribution of amplitude estimates against phase. In this case, a 10 kHz sine wave is generated by a 20-bit DAC, which also has a second harmonic distortion at −80 dB and a third harmonic distortion at −90 dB.

Each estimate of the amplitude of the sine wave is used to calculate an estimate of the gradient of the test signal sine wave at a phase equidistant between the two crossing points. The gradient of the pure sine wave at the same phase is subtracted to remove any influence of the fundamental, thereby leaving a value that represents the effects of non-linearities on the gradient of the pure test signal at this phase. The residual gradient is then binned by quantising its phase and accumulating the result with other samples of the same quantised phase value. By doing this many times, a waveform of the nonlinearities injected by the DAC can be constructed.

$$\frac{dy}{dt} = A\cos\frac{\phi_A + \phi_B}{2} \qquad \text{Equation 2}$$

where:

$$\frac{dy}{dt}$$

Figure 11:
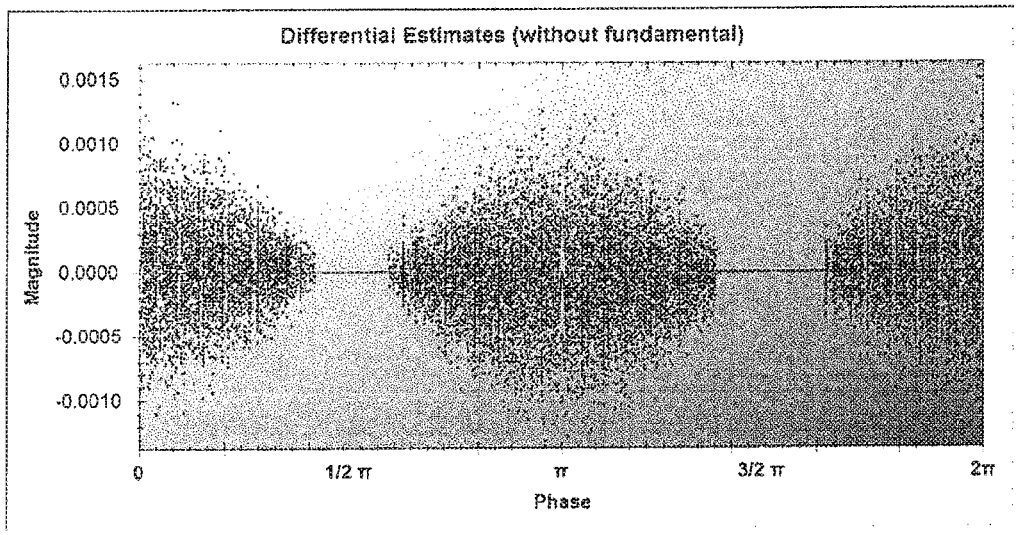
FIG. 11 shows differential estimates having removed the constant fundamental amplitude applied to the data in FIG. 10 corrected for sensitivity to phase.

$\rightarrow$Gradient estimate for this sample
  $A \rightarrow$Amplitude Estimate
  $\phi_A \rightarrow$Phase of the sine wave as it crosses voltage reference A
  $\phi_B \rightarrow$Phase of the sine wave as it crosses voltage reference B FIG. 11 shows differential estimates as a result of Equation 2 being applied to the data in FIG. 10.

The first stage of post processing produces a [phase, magnitude] coordinate for each input sample. These can be manipulated in a number of different ways to construct a representation of the nonlinearity, such as Histogramming, Sparse Recovery, and non uniform spectral analysis.

Figure 12:
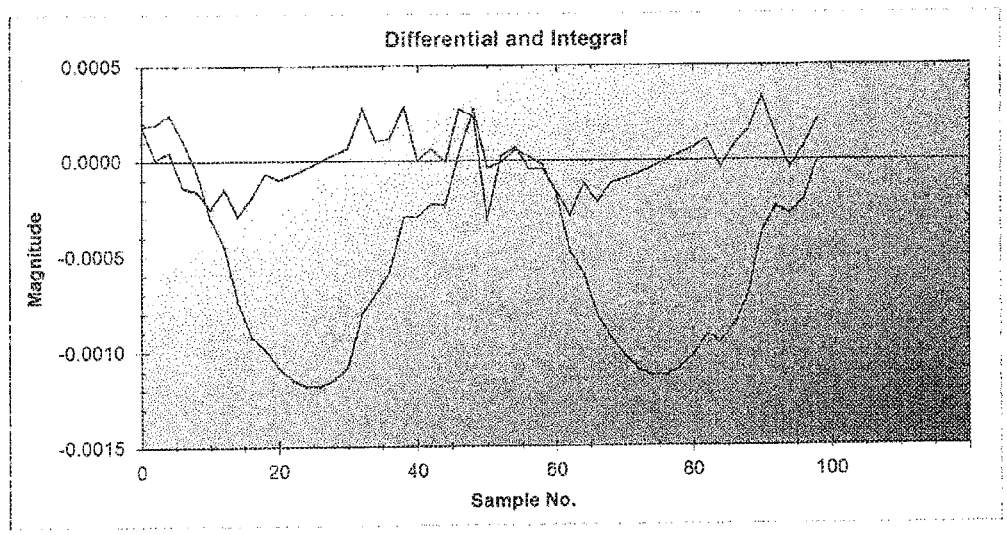
FIG. 12 shows the result of averaging the samples from FIG. 11 into bins, and the integration of those bins having removed the fundamental highlighting the small harmonic distortion signal in the time domain.

For example the post processing phase may consist of averaging all the samples in each bin to create a single cosine wave representation of the gradient of the DAC output. FIG. 12 shows the result of averaging the samples from FIG. 11 into bins, and the integration of those bins. The blue line shows the differential that is the direct result of bin averaging. The red line is the result of integrating the blue line sample by sample. For this a 10 kHz sine wave is passed through a 20-bit DAC which contains a $2^{nd}$ harmonic distortion at −80 dB and a $3^{rd}$ harmonic distortion at −90 dB. The number of points in the reconstructed sine wave determines the number of harmonics that can be detected; typical numbers are 32, 64, or 128. The samples are then integrated to reconstruct an estimate of the original stimulus (comprising a sine wave plus the non-ideal harmonics introduced to illustrate the method).

Figure 13:
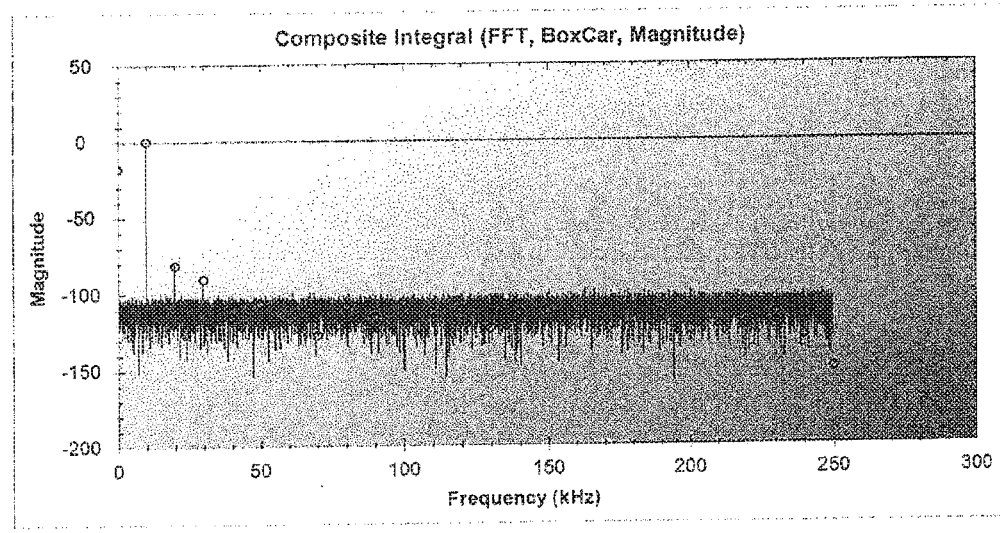
FIG. 13 shows a 'perfect' Fourier analysis of the actual DAC output (red), and the integrated BIST data from FIG. 12 (black circles) showing good agreement.

FIG. 12(red) shows the reconstructed estimate after removal of the fundamental leaving only the estimate of the distortions or non-ideal behaviour to be detected. At this point any complimentary methods are applied to the data to improve performance before the final stage frequency analysis is performed, and any harmonics of interest detected. FIG. 13 shows a fourier analysis of the simulated input data (red), and the reconstructed estimate from the integrated binned data from FIG. 12:black (circles). This shows data for a 10 kHz sine wave generated by a 20-bit DAC which includes $2^{nd}$ harmonic distortion at −80 dB and a $3^{rd}$ harmonic distortion at −90 dB. The method of the invention correctly locates the combined harmonics distortion introduced by the DAC.

The core method is able to collect sufficient data required to reconstruct a precise digital representation of the output of the DAC under test. To improve test integrity several small regions within the sine wave may be handled separately. In addition, a schmooing algorithm can be applied to further improve test precision.

Because the standard sampling method requires the sine wave to pass through two references with a pre-determined voltage difference, it is difficult to collect extensive information at the very top or bottom of the sine wave, as the sine wave is horizontal at this point. This may leave a gap in the sampling process at the top and bottom of the sine wave related to the voltage difference between the two references. To overcome this limitation, several methods may be employed to collect and combine new information specific to the top and bottom of the test signal.

Firstly, bins near the top and bottom may be set to zero, and a Fourier analysis performed to calculate and subsequently cancel any residual elements of the fundamental. Then a new Fourier analysis is performed, and the harmonics with the greatest magnitude are used to fill in the missing data. This spectral interpolation is used instead of temporal interpolation to prevent identified harmonic errors spilling into adjacent harmonic bins, and creates a foundation within the top and bottom regions that allow alternatively derived data to be incorporated with the core method.

Figure 14:
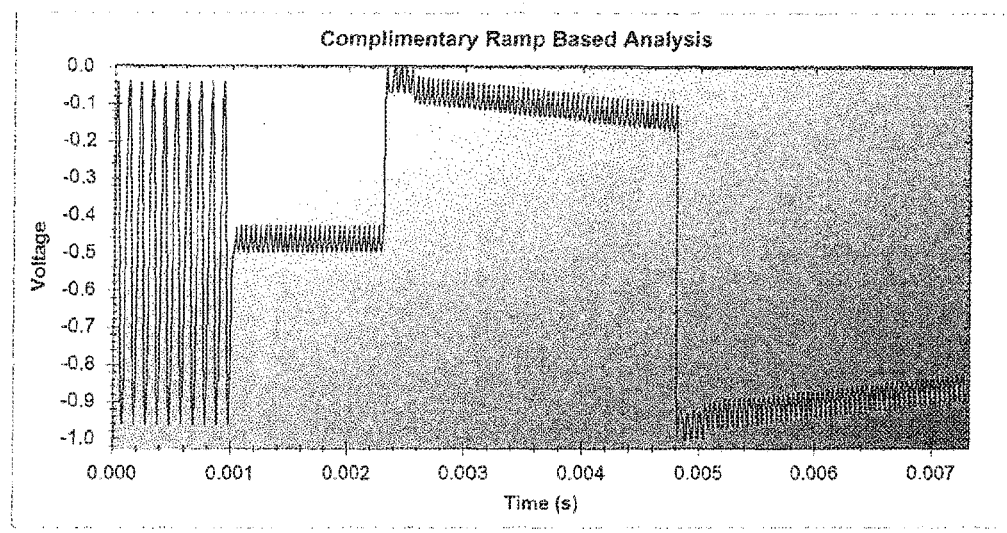
FIG. 14 shows a time domain simulation of ramping signals optionally used to enhance DAC linearity testing at the top and bottom of the device.

To gain greater information regarding the static and dynamic performance at the top and bottom of the device, a series of signals superimposed on the fundamental sine wave such as steps or small ramps may optionally be output by the DAC at the middle of the device to determine a reference slope. The same hardware is used as for the core method, so the time taken to traverse the fixed voltage difference between the two references is used as a gradient metric. Two more series of ramps are then performed, at the top and at the bottom of the DAC range, both slowly schmooing towards the signal mean value. FIG. 14 shows the time domain simulation of the ramping signals used to enhance the test at the top and bottom of the device. Deviations from the reference rate of change are used to complement the results taken by the core method, providing more detail about the change in gain at the top and bottom of the device.

After this information is incorporated, the final stage Fourier analysis can be performed, and any harmonics of interest detected.

Figure 15:
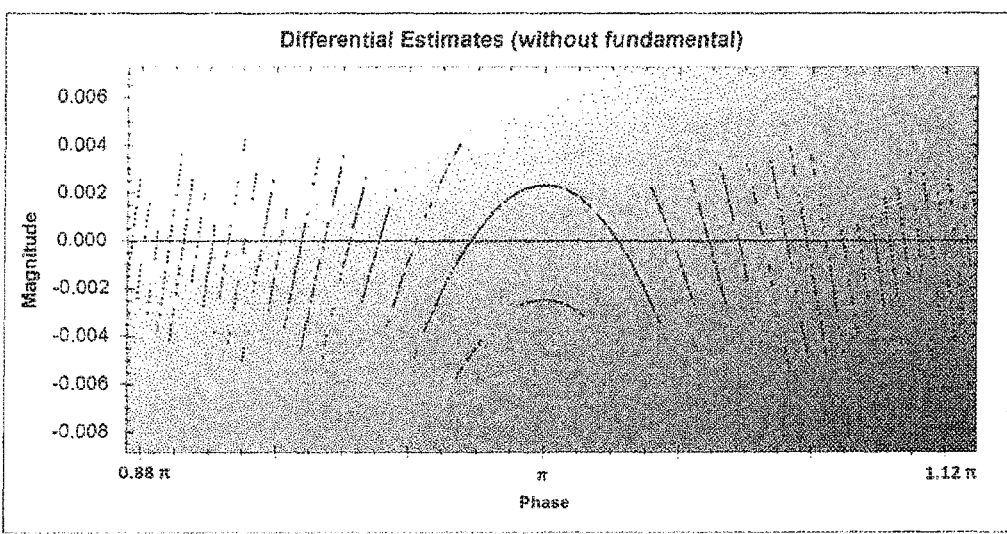
FIG. 15 shows differential estimates for data in the middle bin of FIG. 12.

Certain test conditions create data that can suffer from quantisation error that occurs around the regions of greatest gradient within the sine wave, and hence tends to inject error into the $1^{st}$ and middle bins of the derivative calculation of the core method. FIG. 15 shows a zoom in around the middle bin. Note the curved quantisation lines caused by a limited number of different $\Delta V$ times for a large region of the phase. This offset tends to cause a jump in the derivative at this location and one of opposite magnitude at zero, which when integrated creates a very small square wave and corresponding spurious harmonic errors. These test conditions include a relatively slow clock rate compared to the test frequency, a small voltage difference between references, low noise, or any mixture of all three. To be able to test extremely high linearity DACs under these conditions it is sometimes necessary to interpolate over these two regions or extrapolate the true value from surrounding data.

Figure 16:
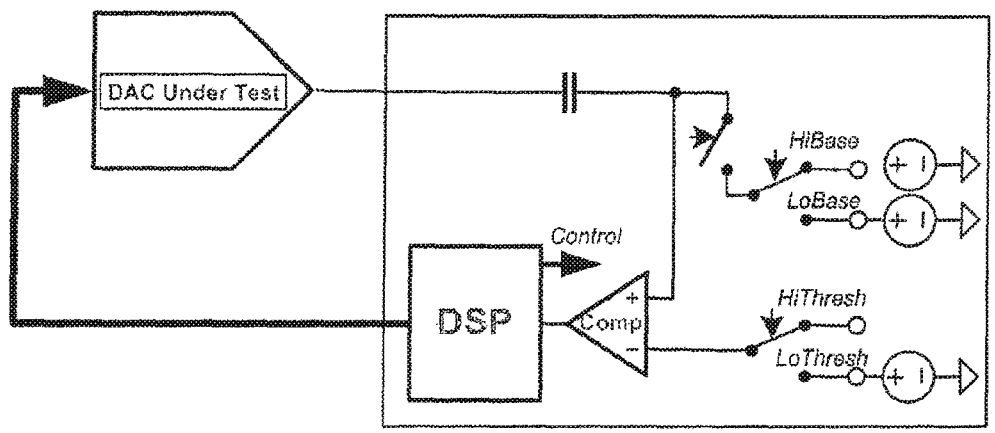
FIG. 16 is another example of circuit diagram for a DAC BIST.

FIG. 16 shows another example of a BIST for testing a DAC that uses a single comparator. As before, a digital signal processor is connected to the DAC and arranged to apply a test signal to its input. The output of the DAC is connected to a capacitor that is connected to a rebasing circuit and the positive input of a comparator. The rebasing circuit has a two-way switch that can switch between a high voltage (HiBase) and a low voltage (LoBase). A threshold circuit is connected to the negative input of the comparator. The threshold circuit has a two-way switch that can switch between a high threshold voltage (HiThresh) and a lower threshold voltage (LoThresh). The high threshold voltage and the low threshold voltage define the fixed voltage difference that is used for setting the voltage segments, as previously described. As before, the rebasing circuit is used to rebase voltage segments so they extended slightly beyond the fixed voltage range set by the comparator.

Figure 17:
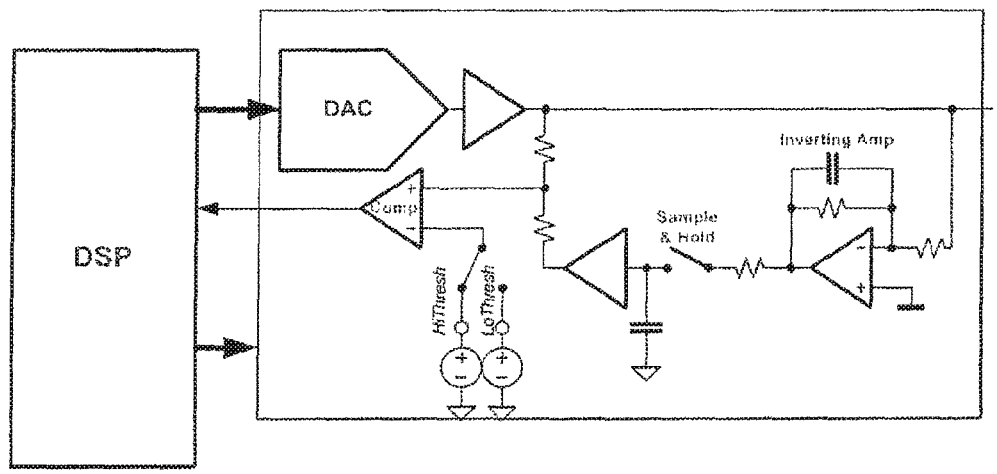
FIG. 17 is yet another example of a circuit diagram for a DAC BIST.

FIG. 17 shows an alternative DAC testing circuit. This is similar to the circuit of FIG. 16, but has a different rebase circuit. In this case, the rebased voltages are created by a simple resister network with one end set by selectively sampling and holding the inverted output voltage under timing control of the BIST DSP. The DAC here may be the device under test or a DAC used to create a stimulus for an ADC (not shown) under test. The DAC, whose output has been accurately sensed, can now be compensated for digitally in the DSP so the stimulus fidelity is increased.

Figure 18:
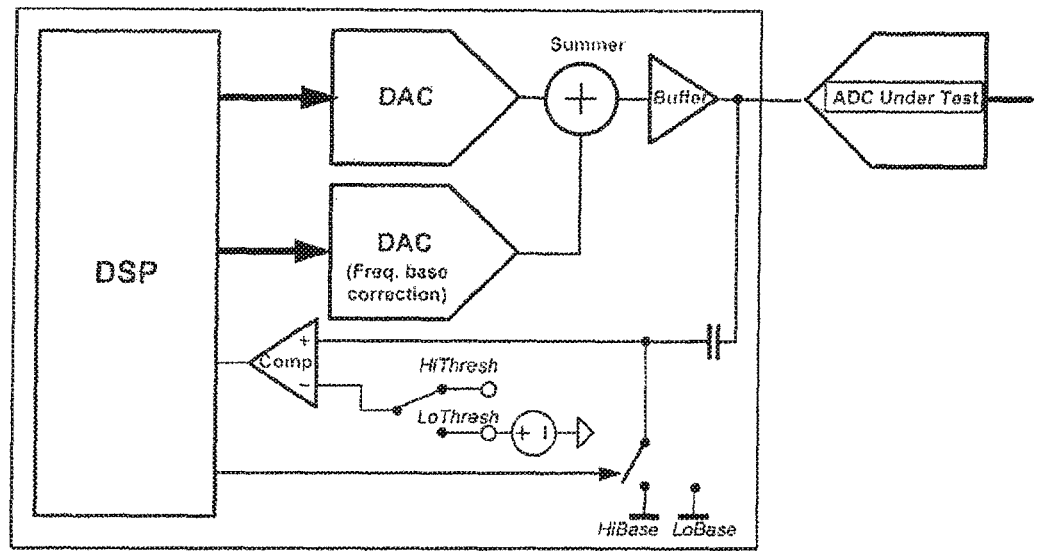
FIG. 18 is a circuit diagram for an ADC test circuit.

FIG. 18 shows an extension of the invention. Here, the DAC test method of the invention is used to improve the fidelity of an analogue test stimulus for testing an ADC. This is done by firstly measuring the DAC performance, and then adding a calculated correction to improve the fidelity of a test stimulus. This is suited to extremely high fidelity ADC testing. The circuit of FIG. 18 has a digital signal processor that is connected to a first DAC that is used to apply a test signal to an ADC and a second DAC for correcting frequency errors detected in the output of the first DAC. The outputs of the first and second DACs are summed, passed through a buffer and applied to the ADC under test.

To ensure the quality of the signal applied to the ADC, the output of the first DAC is tested using the previously described technique of segmenting its output into well-defined fixed voltage segments, determining the duration of the segments and using the voltage and time information to assess the quality of the DAC output. In this case, rebasing may be done using a single switch that is connected to the positive input of a comparator, and the fixed voltage thresholding (between LoThresh and HiThresh) is done using a two-way switch connected to the negative input of the comparator. In the event that the quality of the tested signal is insufficient for the ADC test, the digital signal processor controls the second DAC to correct errors in the output of the first DAC. The summed output of the first and second DACs is continuously monitored and controlled to ensure the fidelity of the test stimulus.

Figure 19:
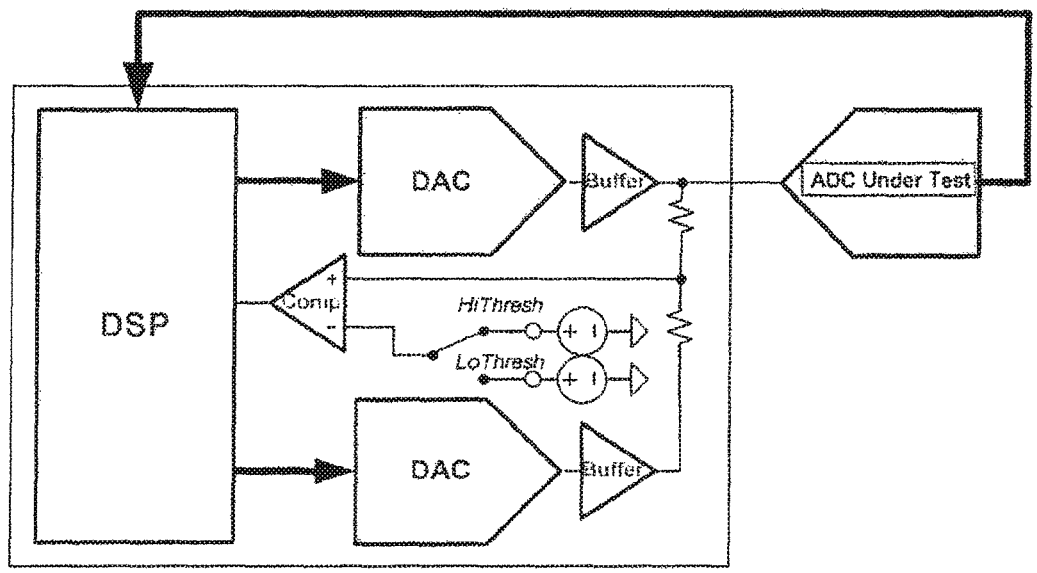
FIG. 19 is a circuit diagram for another ADC test circuit.

FIG. 19 shows an alternative architecture for ADC testing where the fidelity of the DAC used to generate the stimulus is sensed through a resistive network to effect the rebasing. Adding a small resistance to the buffer output permits the rebasing DAC also to act subsequently as the correcting DAC. The method for detecting errors described above with reference to FIG. 12 has the limitation of only being able to detect errors that repeat with each sinusoidal wave, otherwise known as cyclo-stationary errors, such as those created by clipping and slew rate limitations.

An additional source of error in a stimulus comes from a phenomenon known as flicker noise. This is a low frequency noise emanating in this case from the buffer amplifier which increases, theoretically without limit, as the frequency of observation tends to zero. The current invention can remove such noise by using the comparator, such as that shown in FIG. 19, to detect the precise time when the stimulus passes through a known voltage. This may be zero volts in a bipolar sine wave. Any low frequency flicker noise will build up a very slowly changing error voltage causing for example zero volts to be passed earlier or later than expected. Since this is slowly moving both positively and negatively, it may be readily corrected by small adjustments to the DAC by adding or subtracting a small offset on each sample which correction is changed after each sine wave cycle to slowly track the flicker noise. The residual flicker noise appearing at the final output will not now be determined by the buffer amplifier or DAC, but only by the comparator. This comparator can make use of standard chopper stabilised input stage techniques to eliminate its own flicker noise. This gives a novel active flicker noise cancellation technique.

An harmonic content, such as coupled interference, cannot be detected by binning methods as the binning process spreads non-cyclo-stationary signal energy across all bins. To detect an harmonic content a DFT has to be performed on continuously sampled data (not binned data). Because the differential sampling method is non-uniform, an interpolation scheme must be used to create evenly spaced samples that can have a Fourier transform applied to them. Traditional interpolation schemes cause spectral leakage from dominant harmonics to neighbouring ones, giving rise to a measurement error of the dominant harmonic. To mitigate this, a frequency based method may be used to interpolate across gaps in the sampled data using the magnitudes and phases of the most dominant frequencies previously detected in the signal in an earlier calibration period. This reduces the leakage effect of interpolation and reducing the measurement error of the dominant spectral components. Having characterised the distortion, (unwanted harmonic and an harmonic magnitudes and phases), this information may be used to dynamically or otherwise recreate a correction term for the DAC in order to eliminate the errors to give a very high fidelity signal. This method can be used to produce an ADC test stimulus.

Figure 20:
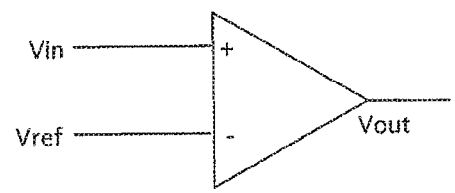
FIG. 20 shows a schematic view of a traditional comparator.

To achieve the best performance when detecting extremely small non-idealities in the signal, the resolution on the clock which measures the interval between the comparator tripping must be high because this sets the sample's quantization noise error limit. Although this is a noise and can be mitigated by averaging lots of samples, the resolution can be improved by employing a non-standard comparator. FIG. 20 shows a conventional comparator which internally uses positive feedback to ensure the output trips very fast but the use of hysteresis or positive feedback requires a non-zero voltage difference to exist across the input before the positive feedback is triggered. This voltage difference depends on the open loop gain of the input stages of the comparator and the slope of the input voltage. A faster rising voltage achieves a greater output voltage sooner which triggers the positive feedback in a shorter time as shown in FIG. 21.

Figure 21:
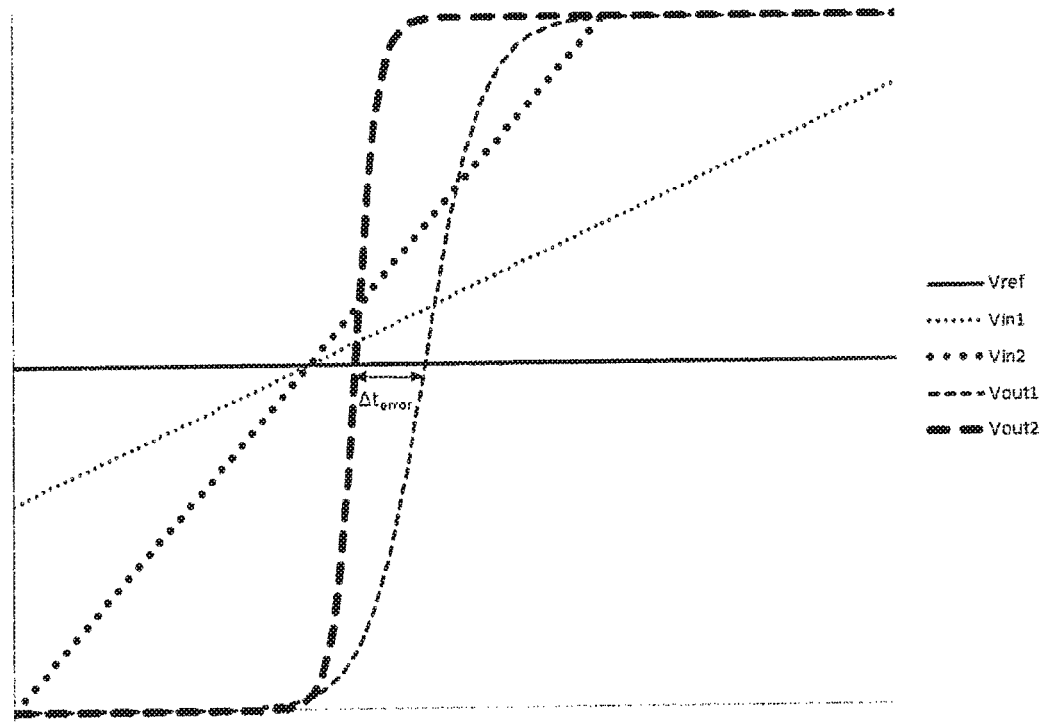
FIG. 21 shows the outputs of circuit of shown in FIG. 20 with two different inputs with different rise rates, illustrating the difference in triggering time $\Delta t_{error}$.

FIG. 21 shows overlays of two different responses from the same comparator which has one fixed reference input while the other input signal traverses through the reference threshold but at two different rates or slopes. This shows the two different inputs with different rise rates resulting in the difference in triggering time $\Delta t_{error}$. These factors result in a variable delay of the output transition in time, relative to the actual time the inputs crossed the reference voltage, depending on the slope or rate of attack of the input signal such as would occur at different point on a sine wave.

Figure 22:
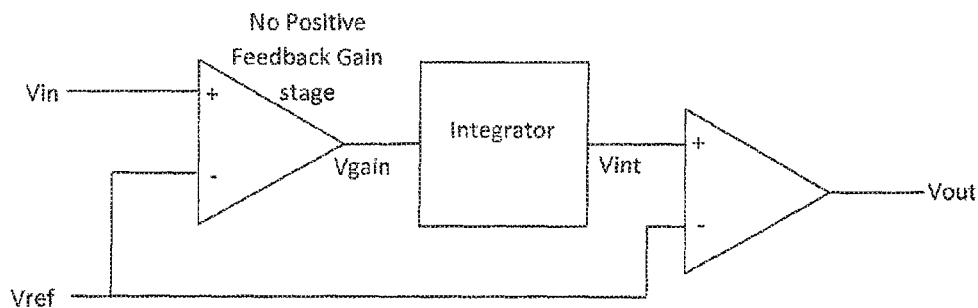
FIG. 22 shows a schematic view of an enhanced comparator using a gain stage, an integrator and a traditional comparator.

Since the present invention requires very precise sensing of voltage-voltage and simultaneously very precise time sensing, but relatively infrequent sample rate, a novel architecture can be employed as shown in FIG. 22.

Figure 23:
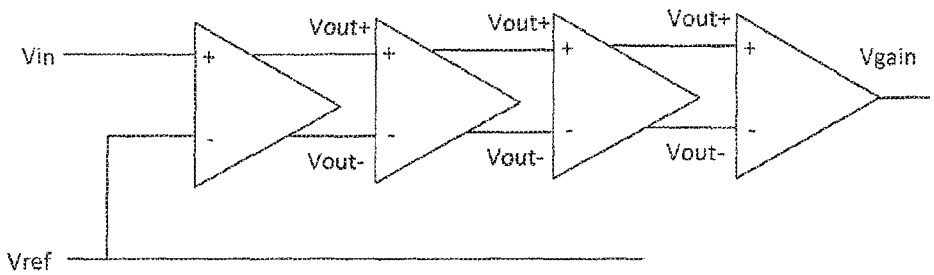
FIG. 23 shows cascaded gain stages which amplify the difference signal without introducing variable delay related to input signal slope.

FIG. 22 shows a schematic view of an enhanced comparator using a gain stage, an integrator and a traditional comparator. The input gain stage can be constructed using a series of simple low gain stages cascade together as shown in FIG. 23. Since each stage, which may be as simple as a differential input stage, has a very high gain bandwidth product yet requires only low gain, the arrangement can have very high small signal bandwidth so the outputs Vout+ and Vout− and ultimately Vgain in FIG. 23 have very low delay variation irrespective of the rate of attack of the input signal within their passband. The objective is no longer to 'square up the signal to give an extremely fast rise time, rather it is to amplify it enough to saturate high or low within a moderate time period, perhaps 10 or twenty times slower than a conventional comparator using hysteresis would require. The low gain but high bandwidth of each stage permits the point at which the Vout+ and Vout− of each stages crosses to exhibit very small variations in the delays, typically less than 100 pS in modern processes for any signal well within the bandwidth of each stage.

The gain stage of the enhanced comparator of FIG. 22 does not use positive feedback. In contrast, a conventional comparator/gain stage would employ positive feedback. However, this adds hysteresis. Although using positive feedback adds a huge amount of gain, effectively 'squaring up' the rising and falling edges of the signal, the price is an increase in the inaccuracy of the precise tripping voltage which now depends on the rate of change of the input. The current invention avoids this issue by obviating the need for positive feedback and using an integrator as described.

Figure 24:
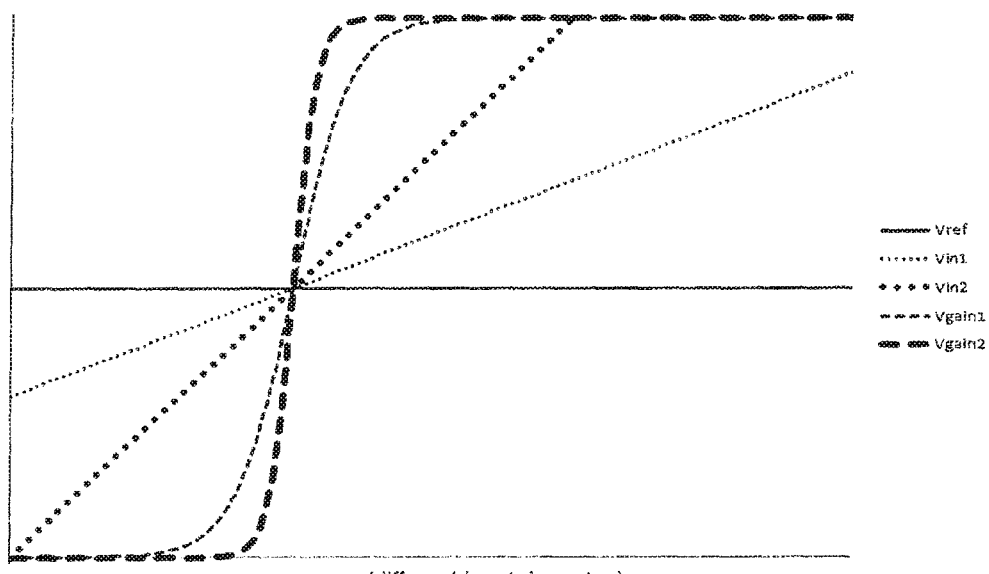
FIG. 24 shows the Vin and Vgain for the circuit shown in FIG. 22 with two different inputs with different rise rates, illustrating that the gain stage output is centred on the same point in time for both inputs.

FIG. 24 shows the Vint and Vgain for the circuit shown in FIG. 22 with two different inputs with different rise rates, illustrating that the gain stage output is centred on almost the same point in time for both inputs that is with little or no delay variation related to slope. Notice that the gain stage output signal saturates at positive or negative state and has a transition period between the two. The output from this gain stage is passed to an integrator which can be a voltage to current converter and mirror into an integrating capacitor.

Figure 25:
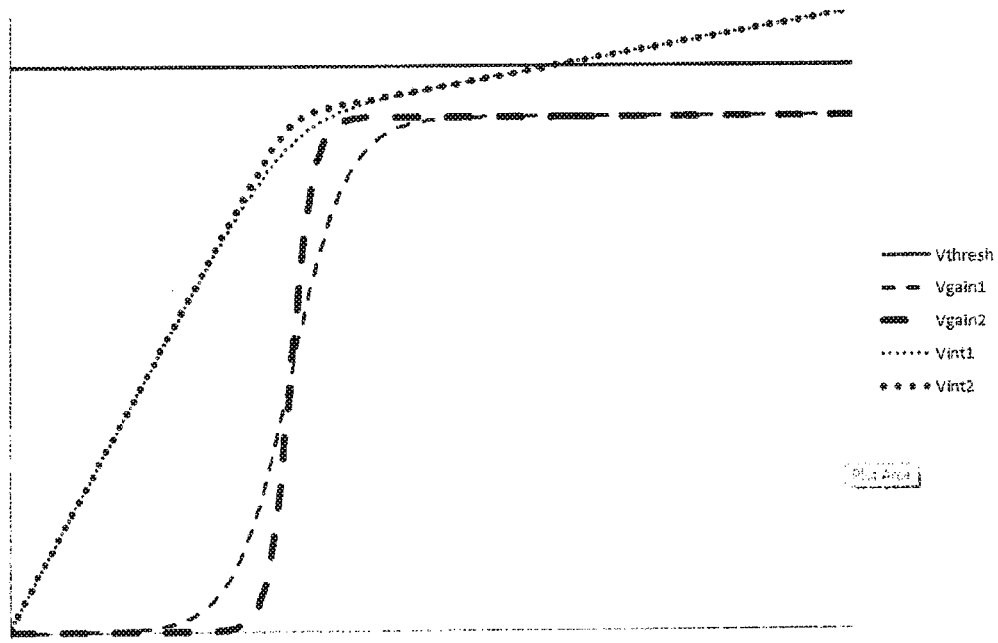
FIG. 25 shows the Vgain and Vint for the circuit shown in FIG. 22 with two different inputs with different rise rates, illustrating that the integrator threshold is crossed at the same time for both inputs.

FIG. 25 shows the Vgain and Vint for the circuit shown in FIG. 22 with two different inputs with different rise rates, illustrating that the integrator threshold is crossed at the same time for both inputs. For convenience, the voltage to current converter and mirror can also invert the currents (ie a high voltage gives a low current and vice versa as shown in this figure). When the Vgain is saturated low (high current) it has a constant voltage and the integrator ramps linearly and relatively quickly. When it is high (low constant current) it ramps linearly but relatively slowly. When Vgain is transitioning between the two saturated levels, the integrator smoothly adjusts its slope and the capacitor also integrates all the current flux as it adjusts. Thus, critically the final voltage on the integrator is independent of how rapidly the slope transitions between the two ramp rates. The job of the integrator is to integrate all the current from before, during and after the transition. Finally, the voltage on the integrator is applied to a conventional comparator which now is always presented with a signal with the same rate of change at the time of crossing its threshold. Although it may have further delays, these will always be the same time, irrespective of the slope of the input voltage before the integrator stage.

Figure 26:
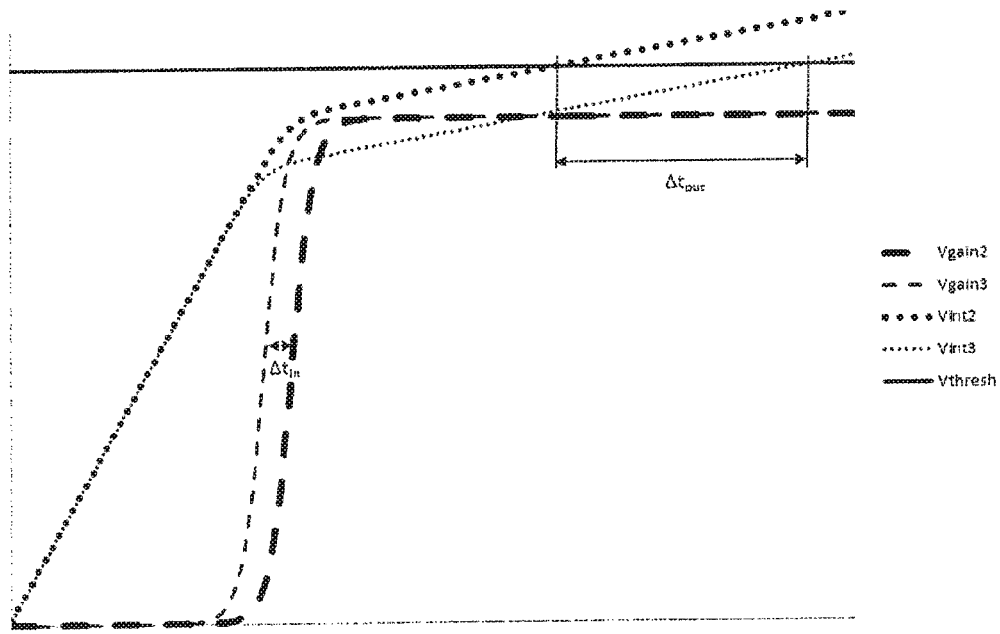
FIG. 26 shows the Vin and Vgain for the circuit shown in FIG. 22 with two different inputs with identical rise rates but delayed with respect to each other, illustrating that the gain stage output is delayed by the same time as the inputs and Vint for the circuit shown in FIG. 22 with two different inputs with identical rise rates but delayed with respect to each other, indicating that the integrator output intersection with the threshold is delayed by more than the difference in the inputs effectively increasing the time resolution for a given final sample rate.

FIG. 26 has the results of two separate runs showing the Vin and Vgain for the circuit shown in FIG. 22 with two different inputs with identical rise rates but where the original inputs to the gain stage had the zero crossing point of one occurring at a later time than the zero crossing point of the other, illustrating that the gain stage output is delayed by the same time as the inputs. It also show the Vint for the circuit shown in FIG. 22, indicating that the integrator output intersection with the threshold is delayed by more than the time difference in the inputs. This 'time stretching' effect has magnitude set by the ratio of the slopes from the integrator for the ramps when integrating a high or a low output. It permits the use of a sampling clock rate at the final comparator output lower than before by the same factor as the slope ratio, while maintaining the same timer resolution and accuracy. Alternatively use the same clock as before to give higher resolution by the factor equal to the slope ratio.

Figure 27:
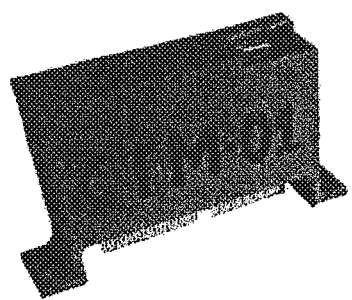
FIG. 27 shows an off-chip component that is adapted to implement the various tests of the invention.

FIG. 27 shows an off-chip embodiment of the invention. In this case, a small module has been created to use the invention to correct a DAC to give a very pure and accurate signal source. Such signal source can be placed on a tester load board in very close proximity to a device under test and controlled using only digital connections to create test stimuli for testing ADCs with very high precision. Fully autonomous variants of such a module can use the invention to test DACs or ADCs and to carry out all processing of results to test or to characterise a converter under test delivering many of the benefits of BIST such as low noise and enhanced purity but without requiring full integration on chip.

A skilled person will appreciate that variations of the disclosed arrangements are possible without departing from the invention. For example, an initial estimation of a reconstructed complete sine wave from the composite stacked interpolated data may be employed together with additional new samples in order to directly estimate non-harmonic interference signals present in the circuit by directly applying a DFT.

As another example, rather than using a comparator to identify the duration of voltage segments, as shown in FIG. 1, and FIG. 16 to 19, a similar result can be achieved using an ADC. Where an ADC is available to replace or augment the comparator function, it can be used directly to acquire additional data about the low gradient top and bottom sections of the signal. In such case, pairs of samples may be collected directly from the ADC to give a gradient metric for each time as before at the top and bottom of the sine wave at fixed intervals. The fixed interval is chosen to be similar to the other pairs of samples measured over the rest of the waveform, so that the magnitude of the derived noise is similar in both the middle and the top and bottom of the detected sine wave. The post processing algorithm already uses gradients between pairs of samples so works immediately with these data points too.

Figure 28:
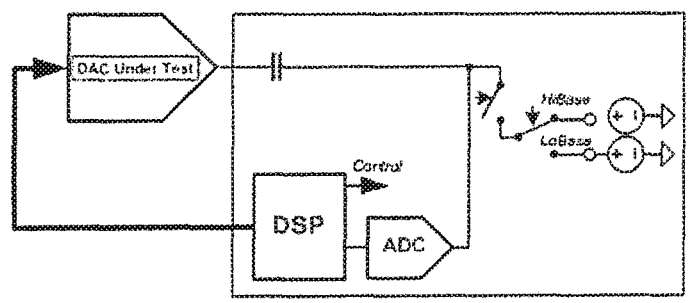
FIG. 28 is a circuit diagram for another DAC test circuit.

FIG. 28 shows another example of a circuit, for example a BIST, for testing a DAC that uses a single ADC. As before, a digital signal processor is connected to the DAC and arranged to apply a test signal to its input. The output of the DAC is connected to a capacitor that is connected to a rebasing circuit and the input to the ADC. The rebasing circuit has a two-way switch that can switch between a high voltage (HiBase) and a low voltage (LoBase). Each ADC code represents a specific input voltage, and so the output ADC code boundaries are defined by the digital signal processor to represent the threshold voltages in the previous example (e.g. FIG. 16) that used a comparator. The high code boundary and the low code boundary define a fixed voltage difference that is used for setting the voltage segments, as previously described. As before, the rebasing circuit is used to rebase voltage segments so they extend slightly beyond the fixed voltage range set by the code boundaries.

Figure 29:
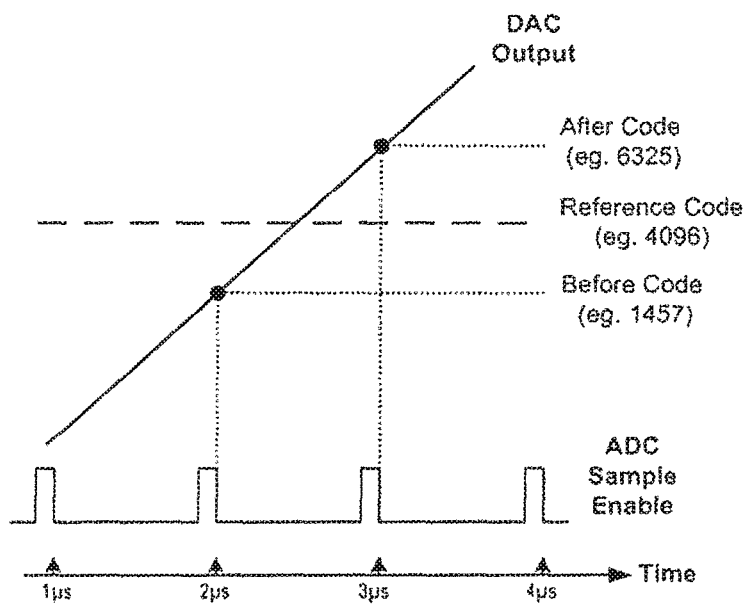
FIG. 29 is a plot of a voltage output of the DAC of the circuit of FIG. 28 as a function and ADC sampling signal.

FIG. 29 shows an example of how the ADC could be sampled to gain greater timing resolution than the sample rate of the ADC. In particular, FIG. 29 shows how a DAC analog output signal traverses a voltage range, and therefore makes the ADC digital output traverse a code range and crosses a reference code boundary, which for this example has been set to 4096. The ADC sample rate is such that it is not possible to produce a sample at the exact point where the ADC output signal crosses the reference code, so instead, both the sampled code immediately preceding the reference code, and the sampled code immediately following the reference code are collected along with the time of their capture. In this example these samples are code 1457 at 2 μs and code 6325 at 3 μs. This information is passed to a post processing algorithm to extract to a much higher resolution the time the DAC output signal crosses the voltage represented by the reference code.

Figure 30:
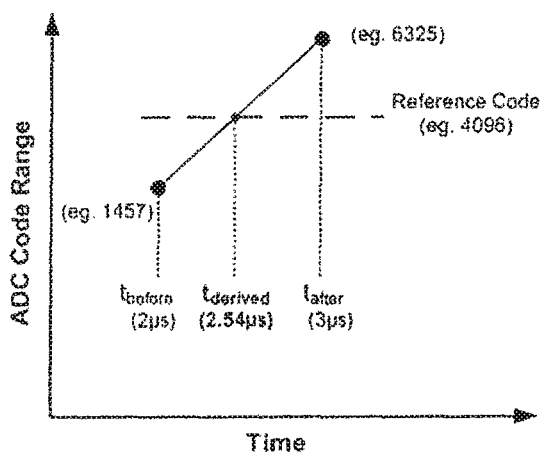
FIG. 30 shows a plot of ADC code range as a function of time for the output of FIG. 29.

FIG. 30 shows an example of how the sample information collected in FIG. 29 could be processed to produce timing information with a higher resolution. FIG. 30 shows two previously collected samples graphed as points within a sample space defined by the time each sample was collected and their value. The gradient between the two points is calculated and used to determine an estimate of the time when the reference code was crossed, but with greater timing resolution than the raw ADC output can provide. For this example, the two points are (2 μs, code 1457) and (3 μs, code 6325). The gradient between them is calculated to be 4868 codes/μs. Assuming the path between the two points is linear, the crossing time of the reference is calculated to be; 2 μs+(4096−1457)/4868 μs, which equals 2.5421 μs.

Accordingly, the above description of the specific embodiment is made by way of example only and not for the purposes of limitation. It will be clear to the skilled person that minor modifications may be made without significant changes to the operation described.

The invention claimed is:

1. A method of using a digital-to-analog converter (DAC) to generate an analog output waveform, the method comprising:
   providing an input code for controlling the DAC digitally to cause the DAC to produce a corresponding analog output;

using a duration of fixed voltage segments determined from an actual analog output of the DAC, applying a correction to the input code of the DAC to produce a corrected input code; and controlling the DAC digitally using the corrected input code to produce the corresponding analog output.

2. The method of claim 1, comprising determining the duration of the fixed voltage segments from the actual analog output of the DAC.

3. The method of claim 2, comprising segmenting the output of the DAC before determining the duration of the fixed voltage segments.

4. The method of claim 3, wherein each segment extends over a voltage range that is slightly larger than that of the corresponding fixed voltage segment.

5. The method of claim 1, comprising using an amplitude or amplitude time gradient for at least one of the fixed voltage segments to determine a correction to the input code of the DAC to produce a corrected input code.

6. The method of claim 1, comprising determining in a frequency domain a correction to the input code of the DAC to produce a corrected input code.

7. The method of claim 1, wherein the analog output waveform is a fixed amplitude sine wave.

8. The method of claim 1, comprising providing active flicker noise cancellation for correcting flicker noise in an analog output of the DAC, the providing active flicker noise cancellation comprising:

detecting a time when the analog output passes a specified point in a repeating signal, identifying variations between the detected time and an expected time and applying a correction to an input code of the DAC to reduce the identified variations to cause correction of the analog output of the DAC such that flicker noise is actively cancelled.

9. The method as claimed in claim 8, further comprising using a chopper stabilized comparator circuit in identifying variations between the detected time and the expected time.

10. A system to generate an analog output waveform, the system comprising:

a digital-to-analog converter (DAC) to generate the analog output waveform using a corrected input code determined using a duration of fixed voltage segments determined from an actual analog output of the DAC to adjust an input code for controlling the DAC digitally to produce a corresponding analog output.

11. The system of claim 10, comprising:

a digital signal processor (DSP) circuit to control the DAC, the DSP circuit comprising:

a digital signal input to receive an input code for controlling the DAC digitally to cause the DAC to produce a corresponding analog output;

a time duration input to receive a duration of fixed voltage segments determined from an actual analog output of the DAC; and wherein the DSP circuit is configured to use the duration to determine and apply a correction to the input code of the DAC to produce a corrected input code to apply to the DAC to control the DAC digitally using the corrected input code to produce the corresponding analog output signal.

12. The system of claim 10, wherein the output of the DAC is segmented before determining the duration of the fixed voltage segments.

13. The system of claim 12, wherein each segment extends over a voltage range that is slightly larger than that of the corresponding fixed voltage segment.

14. The system of claim 11, wherein an amplitude or amplitude time gradient is used for at least one of the fixed voltage segments to determine a correction to the input code of the DAC to produce a corrected input code.

15. The system of claim 10, wherein a correction to the input code of the DAC is determined in a frequency domain.

16. The system of claim 10, wherein the analog output waveform is a fixed amplitude sine wave.

17. The system of claim 10, comprising:

a timer circuit to measure time durations corresponding to various transitions between various DAC analog output voltages corresponding to transitions in digital input codes.

18. The system of claim 17, wherein the timer circuit comprises:

at least one comparator circuit, providing a threshold voltage for comparing at least one corresponding analog output voltage level corresponding to a respective digital input code; and a clock circuit, coupled to the comparator circuit to measure a time in relation to the analog output voltage level meeting the threshold voltage level.

19. The system of claim 18, wherein the at least one comparator circuit includes a chopper stabilized comparator circuit.

20. The system of claim 18, wherein the at least one comparator circuit includes two comparator circuits providing respective first and second threshold voltages for comparing at least one corresponding analog output voltage level against to determine a time duration corresponding to a transition of the analog output voltage level corresponding to transitions in digital input codes.

21. A system to generate an analog output waveform, the system comprising:

a digital-to-analog converter (DAC) to generate the analog output waveform;

a digital signal processor (DSP) circuit to control the DAC, the DSP circuit comprising:

a digital signal input to receive an input code for controlling the DAC digitally to cause the DAC to produce a corresponding analog output;

a time duration input to receive a duration of fixed voltage segments determined from an actual analog output of the DAC; and wherein the DSP circuit is configured to use the duration to determine and apply a correction to the input code of the DAC to produce a corrected input code to apply to the DAC to control the DAC digitally using the corrected input code to produce the corresponding analog output signal.

22. The method of claim 1, wherein the actual analog output of the DAC is a buffered output provided by an amplifier that is coupled to the DAC.

23. The method of claim 1, wherein the duration of the fixed voltage segments are determined using at least one comparator to compare a signal value to at least one threshold value.

24. The method of claim 1, wherein the duration of the fixed voltage segments are determined using an analog-to-digital converter (ADC) to convert an analog signal to a digital signal for digital comparison to one or more digital threshold values.

25. The method of claim 1, comprising providing the corresponding analog output to an input of an analog-todigital converter (ADC) circuit to generate a responsive digital signal output provided by the ADC.

* * * * *